United States Patent [19]

Malazgirt et al.

[11] Patent Number: 4,986,878
[45] Date of Patent: Jan. 22, 1991

[54] PROCESS FOR IMPROVED PLANARIZATION OF THE PASSIVATION LAYERS FOR SEMICONDUCTOR DEVICES

[75] Inventors: Alp Malazgirt, Fremont; Bala Padmakumar, Sunnyvale; Arya Bhattacherjee, Fremont, all of Calif.

[73] Assignee: Cypress Semiconductor Corp., San Jose, Calif.

[21] Appl. No.: 221,310

[22] Filed: Jul. 19, 1988

[51] Int. Cl.$^5$ .......................................... H01L 21/306
[52] U.S. Cl. ..................................... 156/643; 156/657; 156/663; 437/61; 437/228; 437/231; 427/271
[58] Field of Search ............... 156/663, 654, 657, 643; 437/61, 228, 231; 427/271

[56] References Cited

U.S. PATENT DOCUMENTS

| | | | |
|---|---|---|---|
| 4,520,041 | 5/1985 | Aoyama et al. | 437/228 |
| 4,539,744 | 9/1985 | Burton | 437/228 |
| 4,545,852 | 10/1985 | Barton | 437/228 |
| 4,614,666 | 9/1986 | Lindenfelser | 437/228 |
| 4,628,589 | 12/1986 | Sundaresan | 437/228 |
| 4,719,125 | 1/1988 | Anello et al. | 437/228 |
| 4,721,548 | 1/1988 | Morimoto | 437/228 |
| 4,775,550 | 10/1988 | Chu et al. | 437/228 |
| 4,782,030 | 11/1988 | Katsumata et al. | 437/228 |
| 4,783,238 | 11/1988 | Roesner | 437/228 |
| 4,806,504 | 2/1989 | Cleeves | 437/231 |
| 4,826,786 | 5/1989 | Merenda et al. | 437/228 |
| 4,839,311 | 6/1989 | Riley et al. | 437/231 |

OTHER PUBLICATIONS

Adams et al., "Planarization of Phosphorus Doped Silicon Dioxide", J. Electrochem. Society, vol. 128, No. 2, 2/1981, pp. 423-429.

Primary Examiner—David Simmons
Assistant Examiner—Lori-Ann Johnson
Attorney, Agent, or Firm—Blakely, Sokoloff, Taylor & Zafman

[57] ABSTRACT

A method of manufacturing an integrated circuit having a multilayer structure where the method includes the steps of depositing a thin layer of low temperature oxide (LTO) on top of conductors and then spinning and curing a thin layer of spin-on-glass to planarize the surface of the device. This structure is then plasma etched to remove the spin-on-glass and a portion of the LTO at approximately the same rate. The structure is then dipped in a mild potassium hydroxide solution to completely remove the SOG material, even from the crevices and gaps which are present on the surface. This enables the device to be manufactured free of any organic substances from the SOG in the body of the structure. A passivation layer can now be deposited to protect the underlying circuitry from ionic contamination, water vapor penetration and handling.

14 Claims, 4 Drawing Sheets

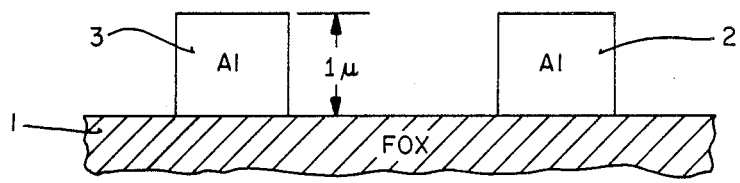
FIG_1A
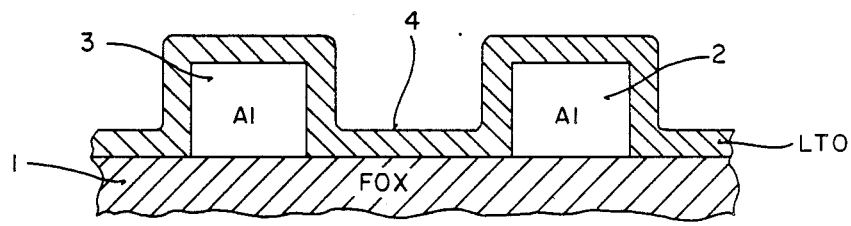
FIG_1B
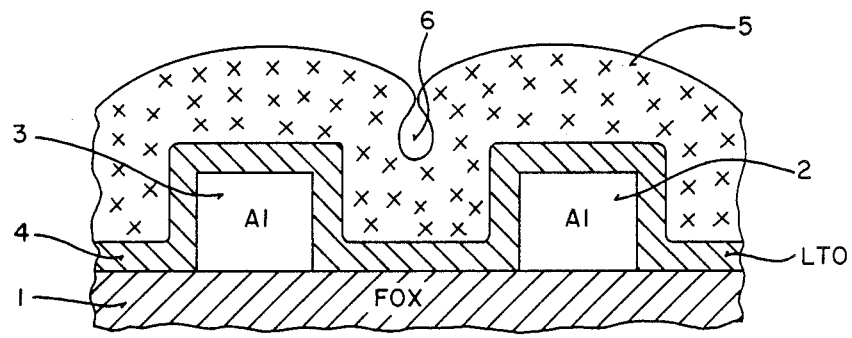
FIG_1C

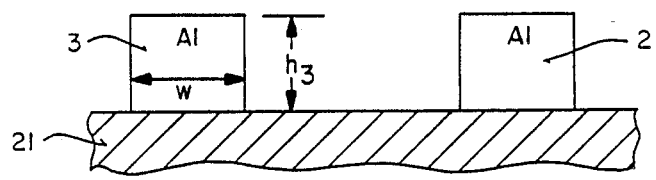
FIG_2A
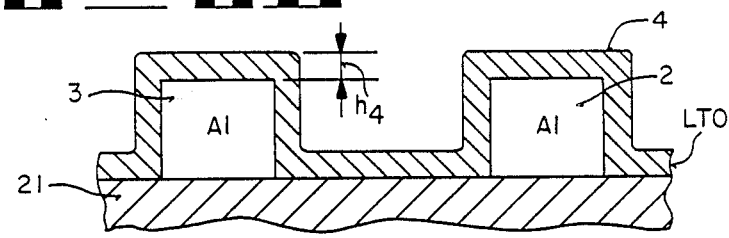
FIG_2B
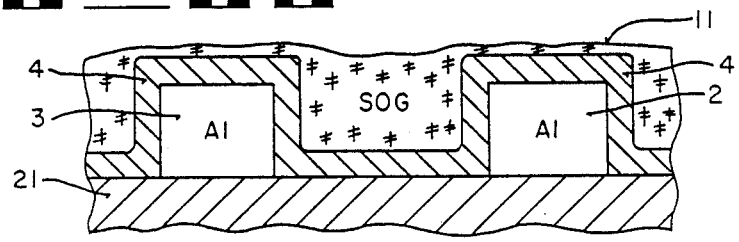
FIG_2C
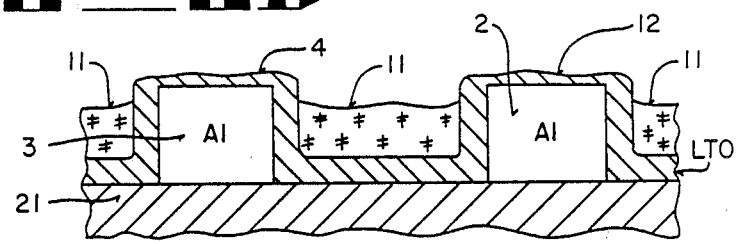
FIG_2D
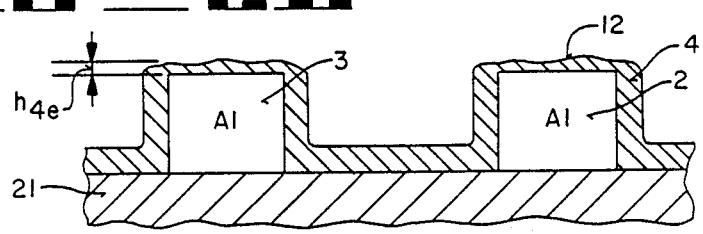
FIG_2E
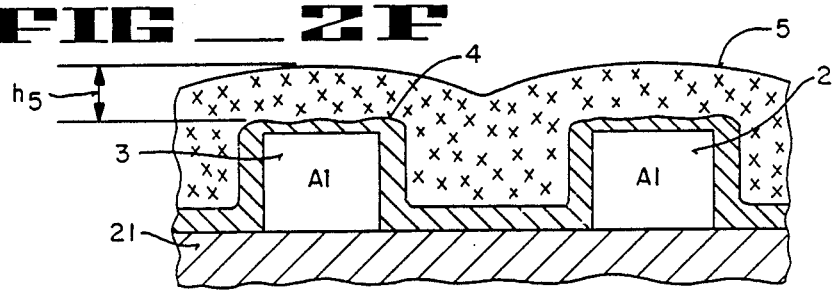
FIG_2F FIG _ 3A (PRIOR ART)
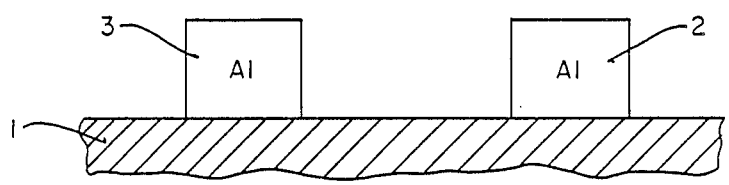
FIG _ 3B (PRIOR ART)
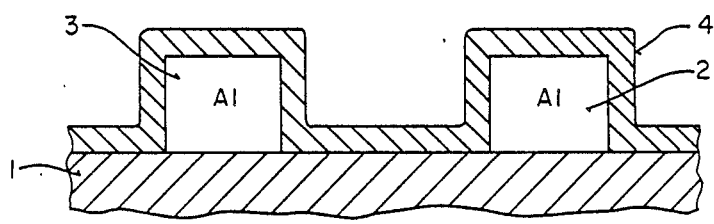
FIG _ 3C (PRIOR ART)
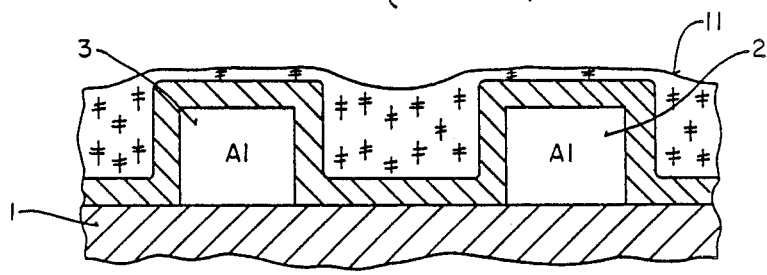
FIG _ 3D (PRIOR ART)
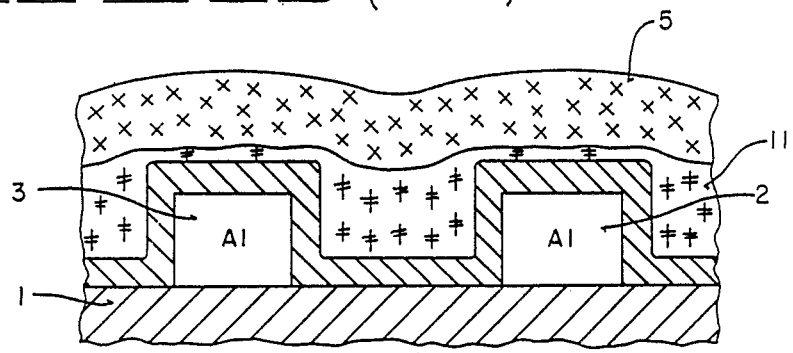

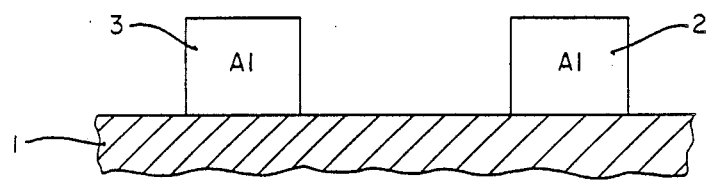
FIG _ 4A (PRIOR ART)
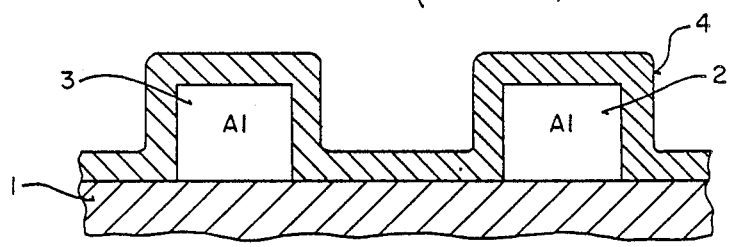
FIG _ 4B (PRIOR ART)
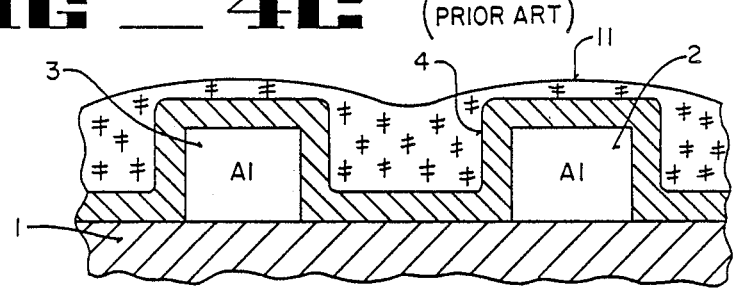
FIG _ 4C (PRIOR ART)
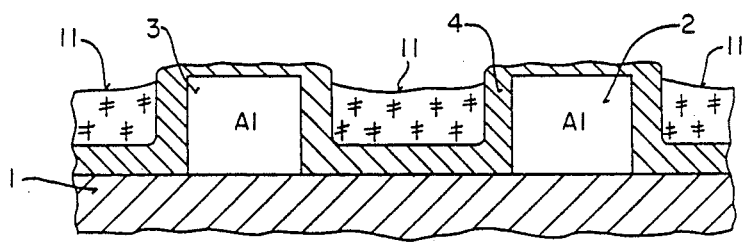
FIG _ 4D (PRIOR ART)
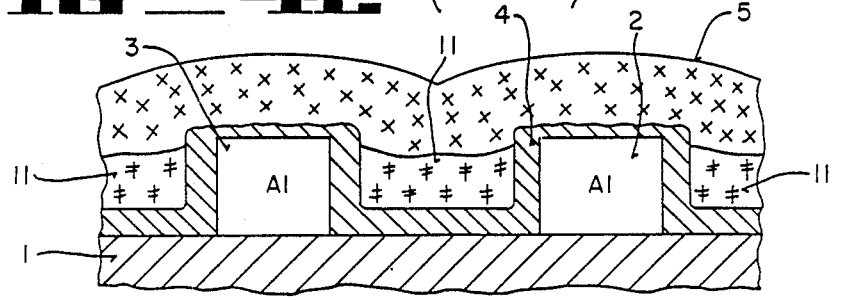
FIG _ 4E (PRIOR ART)

PROCESS FOR IMPROVED PLANARIZATION OF THE PASSIVATION LAYERS FOR SEMICONDUCTOR DEVICES

BACKGROUND OF THE INVENTION

The field of the invention is directed to a method of manufacturing a semiconductor device or a plurality of semiconductor devices in an integrated circuit. More particularly, the invention relates to a novel method of planarizing the surface of an integrated circuit which results in the improved hermetic sealing and scratch protection of the underlying circuitry in the integrated circuit.

The manufacturing processes used for making integrated circuits often involve the formation of various layers upon a semiconductor substrate. For example, the use of multilayer structures such as dual layer metal interconnects to improve the speed of the "metal-oxide-semiconductor" (MOS) semiconductor devices on the integrated circuit is becoming more wide spread. One of the last layers which is applied to the upper surface of the integrated circuit is usually a passivation layer, which in some cases may actually be a plurality of layers applied to make the surface of the integrated circuit less rugged and hence more planar. The passivation layer of the integrated circuit protects, as it is well known, the integrated circuit from the environment including protection against alpha particles, against water and other deleterious substances. Moreover, the passivation reduces the capacitance of the various devices through a field effect.

The passivation layer (or layers) tends to undergo increased stress as the surface topology of the integrated circuit becomes increasingly more complex with many sharp edges and steps. When the surface topology becomes rugged, the passivation layer tends to form weakened areas, particularly where the passivation is thinned or near keyholes such as the keyhole 6 shown in FIG. 1c. Keyholes, such as the keyhole 6, are voids in the passivation layer 5 (layers).

As the number of layers increase, the steps and differences in height between the levels of adjacent layers increase, resulting in the varying thickness of the layers (e.g. passivation layers) deposited on top of these underlying layers. FIG. 1a shows, by a cross sectional representation, an example of the surface topology of an integrated circuit or semiconductor device which may be found in the prior art. Two conductors 2 and 3 run over a field oxide region 1. These two conductors 2 and 3 typically serve to carry the signals through an integrated circuit and they also cause the surface to have many sharp edges, steps and abrupt contours. FIG. 1a shows the upper surface of an integrated circuit where the conductors 2 and 3 have been applied over a field oxide region 1. These conductors often have a height as small as one micron as shown in FIG. 1a. Following the formation of the conductors 2 and 3, a thin low temperature oxide (LTO), which is a dielectric, is layered upon the surface of the integrated circuit thereby covering the conductors 2 and 3 and the field oxide region 1. As shown in FIG. 1b, a layer of low temperature oxide (LTO) 4 has been deposited over the surface of the conductors 2 and 3 and the field oxide region 1. Then, as shown in FIG. 1c a passivation layer 5 has been applied over the surface of the low temperature oxide 4. It can be seen that the variations in the height of the integrated circuit cause the passivation layer 5 to have a more rugged surface which is more likely to produce problems than a smoother surface. If, for example, the passivation layer 5 becomes very thin at a step, breaking and/or cracking of this layer at this step is likely to occur during further processing and/or thermal stressing. Moreover, keyholes often form in "valleys" between tall objects (which are adjacent but spaced apart) on the surface of the integrated circuit. For example, the keyhole 6 shown in FIG. 1c is an area of the integrated circuit where the passivation layer is prone to cracking. This, of course, destroys the effectiveness of this passivation layer which is used to protect the integrated circuit from the ambient. The ruggedness of the surface topology increases as the conductors 2 and 3 are spaced closer together to increase the amount of circuitry contained on each integrated circuit chip.

The passivation layers are often deposited onto the upper surface of the integrated circuit containing the semiconductor devices using well known low temperature and low pressure chemical vapor deposition techniques. Among the materials used for the passivation layers are silicon dioxide ($SiO_2$) and siliconitride ($Si_3N_4$), or some combination of these compounds, which are referred to as oxynitrides. Although these passivation layers are known to produce conformal coatings for widely flat surfaces, they fall short of producing adequate coverage of the rugged topology as the integrated circuit density and complexity increase. As a result, voiding (e.g. the formation of a keyhole) in the passivation layers occurs which poses a reliability concern. This is shown schematically in FIG. 1c, which shows the keyhole 6.

Various techniques in the prior art of topographical planarization are used to overcome these problems. The techniques for topographical planarization must satisfy certain requirements to assure the reliability of the integrated circuits ("ICs"). These requirements include (1) the use of low temperature processing since the planarization must be compatible with the underlying aluminum interconnections (connecting components of the IC) such as conductors 2 and 3; (2) no adverse effects on the electrical properties of the underlying circuitry; (3) ease of manufacturability; (4) high reliability; and (5) high transmittance to ultraviolet radiation for programmable semiconductor devices such as EPROMs (Eraseable Programmable Read Only Memory).

Many methods in the prior art are available for low temperature planarization, such as the methods described in the papers reported in the 1986 Proceedings Third International IEEE VLSI Multilevel Interconnection Conference (1986). These methods include sacrificial etchback using photoresist, bias sputtered quartz and planarization using polyimide films. Spin-on-glass planarization is preferred over these other techniques because of its ease of implementation in large volume device manufacturing and also because it satisfies many of the aforementioned requirements/criteria. For example, polyimide films cannot be used because it blocks ultraviolet radiation which is used to erase EPROMs.

Spin-on-glass is a silicon containing polymer which is dissolved in alcohol-based solvents. This material is in the liquid form and can be applied onto wafers on which are built the semiconductor devices by spinning a few milliliters at high RPMs (revolutions per minute) over the upper surface of the wafers, which normally include a plurality of "chips" (integrated circuits). The planarizing ability of spin-on-glass (SOG) stems from the fact that the SOG as applied in the liquid form, fills the gaps and voids ("Valleys") on the surface, and thins down considerably during spinning as the material is swept across the high points on the surface of the integrated circuit. After spinning the SOG over the integrated circuit, the SOG is hardened into a solid in a process referred to as curing. With straight forward and well known curing in conventional furnaces for about 30 minutes, the spin-on-glass material loses most of its solvents and converts into silicon dioxide, although the silicon dioxide is contaminated with various substances (e.g. sodium). There are many methods for using spin-on-glass to planarize the surface of integrated circuits.

The most straight forward application in the prior art of spin-on-glass planarization is to use the SOG material directly on the top of the integrated circuit, which usually includes the conductors which run across the top of the integrated circuit to interconnect the various components (e.g. MOS devices) in the integrated circuit. Hence, the SOG material is deposited directly over the surface of the integrated circuit as shown in FIG. 1a to cover the conductors 2 and 3. The SOG is in direct contact with the conductors 2 and 3 and the FOX 1 layer. Following the spinning and curing of the spin-on-glass, a thick passivation layer 5 is deposited on the top of the SOG. The resulting structure is substantially as shown in FIG. 3d except that there is no LTO 4 layer in the resulting structure. One serious limitation in this regard is that the SOG thickness can be relatively substantial in the "valleys", such as the space between the metal interconnects (conductors), which results in a number of failures such as cracking of the SOG film. Additionally, the adhesion of the SOG material to the bare metal lines becomes a major failure mode. Therefore, sandwich structures such as low temperature oxide/SOG combinations are preferred.

FIGS. 3a through 3d show a prior art planarization technique utilizing a sandwich structure of low temperature oxide and SOG. Beginning with FIG. 3a, conductors 2 and 3 are applied upon the layer 1, which is often an oxide used to isolate the conductors. This is shown in FIG. 3a. A thin film of low temperature oxide 4 (e.g. silicon dioxide deposited by low temperature chemical vapor deposition) is deposited over the surface of the integrated circuit thereby covering the conductors 2 and 3 and the layer 1 as shown in FIG. 3b. Next, the SOG material is spun on the integrated circuit and cured (in conventional furnaces ("ovens") for 30 minutes at 400° C.) at low temperatures to assure the integrity of the conductors 2 and 3. Following this prior art type of curing, the structure shown in FIG. 3c is produced. Next, the final passivation film 5 is deposited on this highly iso-planar surface which is shown in cross section in FIG. 3d.

A variation in the prior art of this planarization technique includes an etch-back step before the final passivation layer is deposited, and this variation is shown by FIGS. 4a through 4e. As described above, the conductors 2 and 3 are deposited upon the layer 1 to form the structure shown in FIG. 4a. Then, a layer of low temperature oxide 4 is formed upon the surface of the integrated circuit shown in FIG. 4a to thereby form the structure shown in FIG. 4b. The SOG layer is then applied by spinning SOG (in the liquid form) onto the surface of the IC and then curing the SOG material in conventional furnaces kept at 400° C. for 30 minutes to form the structure as shown in FIG. 4c. The variation in the technique is usually done by dry etching (plasma etching) the structure shown in FIG. 4c to remove the very thin spin-on-glass 11 from the high points and a small amount of the low temperature oxide 4 from the high points on the integrated circuit, such as the top of the LTO layer 4 immediately above the top of the conductors 2 and 3. This dry etching step (referred to as an "etch-back") produces the structure shown in FIG. 4d where the areas at lower elevations (e.g. a valley) still contain both the spin-on-glass 11 and the LTO 4, as shown in FIG. 4d. The etch-back step is performed following the application of the SOG layer 11 shown in FIG. 4c. FIG. 4d shows that a portion of the LTO 4 has been removed from the highest elevations of the integrated circuit and a portion of the SOG 11 layer near the top of the integrated circuit has been removed. A final passivation layer 5 is then applied upon the integrated circuit shown in FIG. 4d to produce the structure shown in FIG. 4e.

In these prior art planarization techniques, such as those shown in FIGS. 3a–3d and FIGS. 4a–4e, some SOG remains, particularly in the case of the processing described with respect to FIGS. 3a–3d. A major drawback of these planarization techniques utilizing SOG is the lack of reliability of the devices manufactured in these ways. Spin-on-glass materials are organic based and contain to some extent mobile ions, such as sodium ions, which are detrimental to the transistors used in the integrated circuits. Also, the hygroscopicity (water absorption and retention) of these materials is high such that they induce corrosion of the metal lines (conductors) during the lifetime of the device. Therefore, it is desirable to remove all of the SOG material from the integrated circuit surface without losing the advantage gained from planarizing the surface with SOG material.

Thus, it is an object of the invention to provide an improved technique for planarizing the surface of an integrated circuit while also providing adequate passivation through a passivation layer. It is also an object of the invention to provide a technique for planarization, which technique removes all the spin-on-glass material prior to final passivation but uses the SOG material to improve planarization of the passivation surface.

SUMMARY OF THE INVENTION

The present invention concerns a novel method of planarizing a rugged surface topology of a semiconductor device or integrated circuit with the use of spin-on-glass material which is applied over the surface and then etched back and then removed completely from the integrated circuit (or device) surface. In a process according to the invention, a layer of spin-on-glass is applied over the surface of a LTO layer which covers the integrated circuit. Portions of that SOG layer and of the LTO layer are etched away to reduce the height of the highest areas on the integrated circuit. Next, all spin-on-glass material is removed from the integrated circuit by a low concentration hydroxide solution. At this time, the final passivation layer may be applied over the surface of the integrated circuit. Since the spin-on-glass material has been completely removed, the reliability of the integrated circuit is improved. Moreover, the protection of the integrated circuit from the ambient and from handling is improved because the surface is now more iso-planar.

BRIEF DESCRIPTION OF THE DRAWINGS

FIG. 1a is a cross sectional representation of a portion of an integrated circuit.

FIG. 1b is a cross sectional diagram showing the integrated circuit of FIG. 1a after a layer of low temperature oxide 4 has been deposited upon the surface of the integrated circuit.

FIG. 1c is a cross sectional diagram of the integrated circuit shown in FIG. 1b after the application of a passivation layer 5 which covers the surface of the integrated circuit as shown in FIG. 1c.

FIG. 2a shows a cross sectional representation of a portion of an integrated circuit where conductors have been applied over a layer 21 which forms part of a multilayer structure of the integrated circuit.

FIG. 2b shows the integrated circuit of FIG. 2a after a low temperature oxide layer 4 has been applied (deposited) upon the integrated circuit.

FIG. 2c shows the integrated circuit as shown in FIG. 2b after a spin-on-glass (SOG) material has been applied over the surface of the integrated circuit.

FIG. 2d shows by cross sectional representation the integrated circuit as shown in FIG. 2c after an etching to remove some of the SOG and a portion of the low temperature oxide layer.

FIG. 2e shows a cross sectional representation of the integrated circuit shown in FIG. 2d after the SOG has been removed.

FIG. 2f shows, by cross sectional view, the integrated circuit of FIG. 2e after a passivation layer has been applied to the surface of the integrated circuit thereby covering the integrated circuit as shown in FIG. 2f.

FIG. 3a shows a portion of an integrated circuit where conductors are lying over a layer 1 at the surface of the integrated circuit; FIG. 3a is a cross sectional view.

FIG. 3b shows the integrated circuit of FIG. 3a after a low temperature oxide layer has been deposited upon the surface of the integrated circuit.

FIG. 3c shows the integrated circuit of FIG. 3b after an SOG layer 11 has been deposited upon the surface of the structure shown in FIG. 3b.

FIG. 3d shows the integrated circuit of FIG. 3c after a passivation layer has been applied over the SOG material.

FIG. 4a shows a portion of an integrated circuit where conductors are lying over a layer 1 at the surface of the integrated circuit; FIG. 1a is a cross sectional view.

FIG. 4b shows, in cross sectional view, the integrated circuit of FIG. 4a after a low temperature oxide layer has been deposited upon the surface of the integrated circuit.

FIG. 4c shows the integrated circuit of FIG. 4b after an SOG layer has been deposited upon the surface of the structure shown in FIG. 4b.

FIG. 4d shows, by the cross sectional view, the structure of the integrated circuit shown in FIG. 4c after the surface of the integrated circuit as shown in FIG. 4c has been etched to remove portions of the LTO layer and of the SOG material.

FIG. 4e shows by cross sectional view the portion of the integrated circuit shown in FIG. 4d after a passivation layer 5 has been applied to the surface of the integrated circuit.

FIGS. 1a–1c, and FIGS. 3a–3d, and FIGS. 4a–4e show various steps in prior art techniques in passivation and planarization of integrated circuits.

DESCRIPTION OF THE INVENTION

This invention involves novel techniques for improved planarization of integrated circuits and semiconductor devices which form such circuits. The following description will be made with respect to drawings which illustrate an example of the invention and are not intended as a definition of the invention. In the following description, numerous specific details are set forth such as temperatures, times, thicknesses, etc., in order to provide a thorough understanding of the invention. However, it will be obvious to one skilled in the art that the present invention may be practiced without these specific details. It will be understood by those in the art that the planarization techniques taught herein may be applied to cover and planarize the various different layers used in the multi-layer structures utilized to make integrated circuits, regardless of the underlying layers which form the devices or the integrated circuit used with the invention. Thus, for example, the conductors, such as conductors 2 and 3 may be aluminum or other metals or may be silicides such as titanium silicide or aluminum silicide. It is also understood that the figures show examples of the surface of an IC, and it will be understood that there are many other possible surface structures for ICs. For example, a polysilicon material may be used for the conductors 2 and 3 over an insulator such as the field oxide (FOX) region 21. As another possibility, the objects referred to by the numerals 2 and 3 on, for example, FIG. 2a could also be nonconductors over other materials. Thus, the invention may be utilized to planarize the surface of the passivation layer for a wide variety of semiconductor devices and integrated circuits.

FIGS. 2a through FIG. 2f show a cross sectional view of a portion of the surface of an integrated circuit after the various stages of processing according to the present invention. FIG. 2a is a cross sectional view of the conductors (illustrated by way of example as aluminum metal interconnections) after patterning and etching of the conductors as is well known in the art using conventional photolithographic techniques. The etching of the patterned conductors 2 and 3 may be done anisotropically with the proper choices of gases and plasma etching process conditions as is well known in the art. FIG. 2a shows anisotropically etched conductors 2 and 3. Often, the metal step height, shown as $h_3$ is about one micron. The width of each of these conductors, such as conductor 3 is often, in advanced integrated circuits, as small as about one micron (the w shown in FIG. 2a represents the width of the conductor 3 which may be about one micron). The conductors 2 and 3 have been deposited upon a layer 21 which, in this case would normally be an insulator (dielectric film) which insulates the two conductors 2 and 3 from underlying layers as shown in FIG. 2a. Layer 21 may, for example, be a low temperature dielectric, such as silicon dioxide, deposited in well known, conventional semiconductor processing techniques (see, e.g., *Silicon Processing for the VLSI Era, Vol. 1-Process Technology*, S. Wolfe and R. N. Tauber, Lattice Press, Inc., 1986).

A thin low temperature oxide layer 4 is then deposited upon the surface of the integrated circuit shown in FIG. 2a to form the structure shown by cross sectional view in FIG. 2b. The LTO 4 layer is usually deposited upon the entire surface but it may, using well known photolithographic techniques, be selectively deposited over certain portions of the surface of the integrated circuit. The low temperature oxide (LTO) 4 is a dielectric film which is deposited at low temperatures and pressures as is well known in the art in conventional dielectric furnaces. The nominal thickness of this layer is about 4,000 angstroms; thus, the height of the LTO 4 layer is about 4,000 angstroms ($h_4$ is 4,000 angstroms). The LTO 4 layer at this point in the processing normally covers the surface of the integrated circuit thereby covering the layer 21 and the conductors 2 and 3 as shown in FIG. 2b.

A spin-on-glass SOG 11 material is then applied to the surface of the integrated circuit shown in FIG. 2b to form the structure shown in FIG. 2c. The spin-on-glass material is spun on the integrated circuit in the conventional, well known manner. The planarizing capability of the SOG 11 material is self-evident from this cross sectional view shown in FIG. 2c. A highly rugged surface, such as that shown in FIG. 2b, is now made more iso-planar and there are no sharp corners or abrupt contours. It can be seen from FIG. 2c, that the thickness of the SOG 11 material is variable as shown in the cross section. The SOG material, after a special curing process according to the present invention should cover the tops of the steps (e.g. conductors 2 and 3) by about 500 Angstroms. The SOG 11 (after the special curing process) has a height of about 8,000 Angstroms over the base of the average valley.

The special curing process involves a three (3) step 'soft baking' on three separate baking plate means (e.g. heating plates maintained at elevated temperatures). In a preferred embodiment of this special curing process, the integrated circuit is placed for 30 seconds on a first baking plate means which is maintained at about 100° C.; the integrated circuit (IC) is then removed (at the end of the first 30 seconds) from the first baking plate means and placed on a second baking plate means for a second 30 seconds. The second baking plate means is kept at about 175° C. At the end of the second 30 seconds, the IC is removed from the second baking plate means and is placed on a third baking plate means for a third 30 seconds. The third baking plate means is kept at 250° C. At the end of the third 30 seconds, the IC is removed from the third baking plate means and the special curing process is completed. This special curing process may be modified in many ways, including having any number of baking steps at various temperatures below 300° C. Moreover, the ramping (i.e. increasing) of the temperature may be made more slowly or more quickly. The SOG 11 shown in FIGS. 2c and 2d is, of course, specially cured SOG. It will be understood that the SOG shown in FIGS. 3 and 4 is cured by heating in conventional furnaces kept at 400° C. for 30 minutes.

It is important to form SOG 11 films which, after curing, have a height not exceeding about 8,000 angstroms as thicker SOG 11 films tend to crack more readily than thinner SOG films. Hence, SOG 11 material is very thin at the edges of the steps and at the top of the steps, such as the conductors 2 and 3, and it is thick when it fills the gaps ("valleys") between the conductors 2 and 3.

The integrated circuit, a portion of which is shown in FIG. 2c, is then subjected to a plasma etch to etch back portions of the surface of the integrated circuit. FIG. 2d shows a cross sectional view after a brief plasma etch is performed. It is important for the objective of improved planarization that the spin-on-glass 11 and the LTO layer 4 be removed by the plasma etching uniformly at approximately the same rate (i.e. the selectivity of etching of SOG with respect to LTO is about 1). The plasma etch process conditions are chosen such that the selectivity of the plasma etch of SOG 11 with respect to the LTO 4 is about 1(one). In the preferred embodiment using an SOG material designated as SOG 208 from Allied Chemicals, the plasma etching is done in a conventional plasma etcher machine with the gases $C_2F_6$ and He which are at a combined pressure of 2 torr and have been energized in a radio frequency field having a power of 450 watts. The etch time in this plasma is about 0.4 minutes. The gas $C_2F_6$ is provided into the plasma etching chamber at a flow of 25 sccm (standard cubic centimeters per minute), and the gas He is provided into the etching chamber at a flow of 85 sccm. The use of different SOG materials may require minor modification of the chemistries (e.g. the addition of small amounts of the gas $CHF_3$ to the etching chamber during etching) to maintain the desired selectivity; these modifications may be readily ascertained by those skilled in the art. The resultant profile after the short plasma etch is shown in FIG. 2d. It can be seen that a portion of the spin-on-glass 11 material has been removed from the tops ("peaks") of the steps. Moreover, approximately 2,000 angstroms of the low temperature oxide 4 layer has been removed from the top of the steps such as the top 12 shown in FIG. 2d. In the gaps between the conductors 2 and 3, however, there is still a considerable amount of spin-on-glass 11 material which has not been removed (for example, about 5,000 Angstroms (in height) of SOG often remains in a gap). Thus, the LTO layer 4 has a smaller height, $h_{4e}$, which is approximately 2,000 angstroms at the tops of the steps, such as top 12, while the LTO layer 4 still has a height of approximately 4,000 Angstroms at the base of the gaps between the conductors 2 and 3. It will be appreciated that the SOG acts as a mask against the etching of the bottoms of the LTO 4 (i.e. in the valleys) while allowing etching of the tops of LTO 4.

In the next step of the process, the SOG 11 material is removed without removing any significant portions of the LTO 4 layer. The result of the removal of the SOG 11 from the integrated circuit is shown in FIG. 2e. In the preferred embodiment, a weak solution of potassium hydroxide (KOH) is used to remove the SOG 11 from the surface of the integrated circuit. Other simple hydroxide solutions may be used (e.g. NaOH, etc.) instead of potassium hydroxide. This etching step in a weak potassium hydroxide solution must be controlled very carefully so that the spin-on-glass 11 material is removed with no thinning of the LTO 4 layer because further thinning of the LTO 4 layer would defeat the purpose of planarization with the sandwich structure. Because the spin-on-glass 4 material is partially silicon dioxide, the chemicals which are commonly used for silicon dioxide wet etching would also normally remove the spin-on-glass material 11. A novel application in this invention is the use of a mild potassium hydroxide solution to remove the spin-on-glass very selectively over the LTO 4 without removing portions of the LTO 4 layer. Thus, a key aspect of the invention is the reduction ("thinning") of the height of the LTO 4 at the tops of the steps, such as top 12, to the height $h_{4e}$, but no reduction of the height of the LTO at the bottom of the steps (which should still be height $h_4$), particularly in the gaps (valleys) between the conductors. In the preferred embodiment a 0.28 percent solution of potassium hydroxide is used for six (6) minutes on the IC; in one preferred embodiment a commercially available developer for photoresist called Microposit 453 from Hunt Chemical is used directly as the weak potassium hydroxide solution to remove the SOG on the IC. This solution does not etch the LTO 4 but it does remove the SOG 11. The following table shows a comparison of the selectivity of various solutions which are used as oxide etchants:

| Solution | Selectivity (SOG etch rate/ LTO etch rate) |
|---|---|
| (a) 4:1 $H_2O$:KTI Pad Etch | 9/1 |
| (b) 100:1 $H_2O$:BOE | 11/1 |
| (c) KOH Solution of invention | Infinity |

As is evident from the above table, the very high selectivity achieved with the mild potassium hydroxide solution enables the effective removal of the spin-on-glass 11 material with no discernable attack of the LTO 4. The KTI Pad Etch is a well known brand name (available from: KTI Chemicals, Inc., a subsidiary of Union Carbide) of an oxide etchant which contains hydrofluoric acid and is diluted by a ratio of 4 to 1. The solution "BOE" is a buffered oxide etch which contains hydrofluoric acid. It can be seen that the buffered oxide etchant (BOE) has a selectivity of 11 which means that it etches SOG eleven times faster than it etches an LTO material. While this selectivity is useful in some applications, it is not as advantageous as the etchant of the invention which has virtually an infinite selectivity. The resultant cross section following the removal of SOG is shown in FIG. 2e.

A passivation layer 5 may now be applied upon the integrated circuit, such as that shown in FIG. 2e to form the structure shown in FIG. 2f. In particular, the passivation layer 5 is applied over the surface of the integrated circuit represented by FIG. 2e to form the structure, by way of example, in FIG. 2f. The layer of passivation material 5 may be any one of a number of substances, including silicon dioxide, silicon nitride, or a combination of those substances, which combination is referred to as oxynitrides. The various passivation materials, using well known techniques, are usually deposited with low pressure and low temperature chemical vapor deposition techniques. The passivation layer 5 preferrably has a height over the tops 12, as indicated by the reference character $h_5$ of approximately 1.5 microns. Because the underlying topology is now more isoplanar, the conformality of the passivation layer 5 is excellent while at the same time no SOG 11 remains as part of the integrated circuit thereby improving the reliability of the integrated circuit. The process of the invention to some extent involves a loss of planarization, when compared to the planarization techniques shown and described with reference to FIG. 3d or FIG. 4e; however, in trade for that loss there is improved reliability due to the absence of SOG. At the same time, the present invention has improved planarization when compared to the process which results in the structure shown in FIG. 1c.

The aspect ratio of the steps (e.g. conductor 2) is a measure of the planarization of the surface of an integrated circuit. Two adjacent but closely spaced apart layers forming steps will form a valley. The aspect ratio of a step is given by the ratio of the width of the step divided by the height of the step. For example, the aspect ratio of conductor 3 shown in FIG. 2a is $W/h_3$; if $W = 1.5$ microns and if $h_3 = 1.0$ micron then the aspect ratio of the conductor 3 is 1.5. It is understood that, for this definition of aspect ratio, the larger ratios indicate better planarization than smaller aspect ratios. Assuming that the height of conductor 3 in FIG. 1c is 1 micron (measuring the height from the surface of the LTO in a valley—to—the surface of the LTO 4 on the top of the conductor 3) and the width of the step (conductor) as covered by the LTO 4 in FIG. 1c is 2.3 microns (1.5+0.4+0.4), then the aspect ratio for conductor 3 shown in FIG. 1c is 2.3 (2.3/1). The aspect ratio of a step planarized using this invention will be illustrated by FIG. 2f. It can be seen that the width of the step of conductor 3 (and its LTO 4 layer) of FIG. 2f is 1.5+0.4+0.4 or 2.3 microns (the width of the conductor 3 itself is 1.5 microns and the LTO 4 adds 0.4 microns to each side). The height of the step of conductor 3 (with its LTO cap) of FIG. 2f is 0.8 microns (1+0.2−0.4=0.8); that is, the 2000 Angstroms removed from the LTO at the tops of the steps has reduced the height of the step to 0.8 micron. Thus, the aspect ratio of the step of conductor 3 shown in FIG. 2f is (2.3/0.8=2.88)2.88. Hence, the aspect ratio of a step planarized according to the present invention is higher than the aspect ratio of a step as shown in the prior art structure of FIG. 1c. Of course, the structures shown in FIGS. 3d and 4e have even higher aspect ratios but they contain the SOG 11 material which causes its own set of problems.

While the invention has been described with reference to figures which illustrate an example of the invention, the scope and spirit of the invention is defined by the following claims.

We claim:

1. A process for planarizing the surface of a semiconductor device having a multilayer structure, said process comprising:
   depositing a dielectric layer over at least a portion of the surface of said semiconductor device;
   applying a layer of spin-on-glass over the surface of said dielectric layer;
   etching away portions of said layer of spin-on-glass and portions of said dielectric layer;
   removing the remaining portions of said layer of spin-on-glass;
   applying a passivation layer over the surface of said semiconductor device.

2. A process as in claim 1 wherein during said step of etching away portions of said layer of spin-on-glass and portions of said dielectric layer, said portions of said layer of spin-on-glass are removed at about the same rate as said portions of said dielectric layer are removed., 3. A process as in claim 1 wherein a hydroxide solution is used to remove the remaining portions of said layer of spin-on-glass.

4. A process as in claim 2 wherein a potassium hydroxide solution is used to remove the remaining portions of said layer of spin-on-glass without removing any significant amount of said dielectric layer, and wherein said dielectric layer is a low temperature oxide.

5. A process for planarizing the surface of an integrated circuit said surface having a rugged topology including valleys and tops, said process comprising:
   depositing a dielectric layer over the surface of said integrated circuit;
   applying a layer of spin-on-glass over the surface of said dielectric layer;

etching away portions of said layer of spin-on-glass and portions of said dielectric layer wherein the portions of said dielectric layer that are etched away are at the tops of the surface of said integrated circuit while other portions of said dielectric layer in the valleys are not etched away and wherein the portions of said layer of spin-on-glass that are etched away are at the tops of the surface of said integrated circuit, and wherein said portions of said layer of spin-on-glass are removed at about the same rate as said portions of said dielectric layer are removed;

removing the remaining portions of said layer of spin-on-glass by exposing said remaining portions to a hydroxide solution for a short period of time; and applying a passivation layer over the surface of said integrated circuit.

6. A process as in claim 5 wherein a potassium hydroxide solution is used to remove the remaining portions of said layer of spin-on-glass without removing any significant amount of said dielectric layer.

7. A process as in claim 5 wherein said passivation layer comprises silicon dioxide.

8. A process as in claim 5 wherein said passivation layer comprises silicon dioxide deposited by low temperature chemical vapor deposition.

9. A process as in claim 5 wherein said passivation layer comprises an oxynitride deposited by low temperature chemical vapor deposition.

10. A process for planarizing a passivation layer applied to cover the surface of an integrated circuit containing metal-oxide-semiconductor (MOS) devices, said process comprising:

depositing a layer of a thin low temperature oxide over at least a portion of the surface of said integrated circuit said portion of said integrated circuit including, two adjacent, spaced apart layers forming steps each having a top and forming a valley between said steps, said layer of low temperature oxide covering said tops and said valley;

applying a layer of spin-on-glass over the surface of said layer of thin low temperature oxide, said layer of spin-on-glass being applied by spinning said integrated circuit with a liquid spin-on-glass material over the surface of said integrated circuit and curing said liquid spin-on-glass material by thermal processing at low temperature to form said layer of spin-on-glass;

plasma etching portions of said layer of spin-on-glass and portions of said layer of thin low temperature oxide, said plasma etching thinning said layer of thin low temperature oxide on said tops but not thinning said layer of thin low temperature oxide on said valley, said plasma etching step etching said layer of spin-on-glass at about the same rate as said plasma etching step etches said layer of thin low temperature oxide;

removing the remaining portions of said layer of spin-on-glass by etching said remaining portions of said layer of spin-on-glass in a potassium hydroxide solution for a short period of time without removing any significant amount of said layer of low temperature oxide; and applying said passivation layer over the surface of said integrated circuit, whereby the planarization of said passivation layer has been achieved without any spin-on-glass remaining as part of the final structure of said integrated circuit.

11. A process as in claim 10 wherein the short period of time for the etching of the remaining portions of said layer of spin-on-glass is less than seven (7) minutes.

12. A process as in claim 11 wherein said passivation layer comprises silicon dioxide deposited by low temperature chemical vapor deposition.

13. A process as in claim 10 wherein said integrated circuit comprises a plurality of components and wherein said two adjacent, spaced apart layers forming steps are two conductors used to interconnect the components of said integrated circuit.

14. A process as in claim 10 wherein said two adjacent, spaced apart layers forming steps are two conductors used to interconnect the MOS devices of said integrated circuit.

* * * * *